(12) United States Patent
Shioji (10) Patent No.: US 11,349,049 B2
(45) Date of Patent: May 31, 2022

(54) SEMICONDUCTOR ELEMENT, SEMICONDUCTOR DEVICE, AND METHOD FOR MANUFACTURING SEMICONDUCTOR ELEMENT

(71) Applicant: NICHIA CORPORATION, Anan (JP)

(72) Inventor: Shuji Shioji, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/717,105

(22) Filed: Dec. 17, 2019

(65) Prior Publication Data

US 2020/0140750 A1 May 7, 2020
US 2020/0291292 A9 Sep. 17, 2020

Related U.S. Application Data

(62) Division of application No. 15/590,458, filed on May 9, 2017, now Pat. No. 10,586,896.

(30) Foreign Application Priority Data

May 11, 2016 (JP) .............................. JP2016-095688

(51) Int. Cl.
*H01L 33/46* (2010.01)
*H01L 33/40* (2010.01)
(Continued)

(52) U.S. Cl.
CPC ............ *H01L 33/46* (2013.01); *C09K 11/621* (2013.01); *H01L 33/405* (2013.01); *H01L 33/486* (2013.01); *H01L 33/502* (2013.01); *H01L 33/507* (2013.01); *B82Y 20/00* (2013.01); *B82Y 40/00* (2013.01); *H01L 33/382* (2013.01); *H01L 2933/0016* (2013.01);
(Continued)

(58) Field of Classification Search
None
See application file for complete search history.

(56) References Cited

U.S. PATENT DOCUMENTS

2012/0256221 A1* 10/2012 Ogawa .................. H01L 33/405
257/98
2012/0305889 A1* 12/2012 Lim ....................... H01L 33/405
257/13

(Continued)

FOREIGN PATENT DOCUMENTS

GN  104821357 A  8/2015
JP  H05-275739 A  10/1993
(Continued)

OTHER PUBLICATIONS

Extended European Search Report from EP Application No. 17170327.5, dated Jul. 18, 2017, 8 pages.

*Primary Examiner* — Jay C Chang
(74) *Attorney, Agent, or Firm* — Hunton Andrews Kurth LLP (57) ABSTRACT

A semiconductor light emitting element is provided. The semiconductor light emitting element has a semiconductor stack, an n-side conductor layer, a p-side conductor layer, a dielectric multilayered film, an n-side reflective layer and a p-side reflective layer, disposed in that order. The n-side and p-side reflective layers contain Ag as a major component and contain particles of at least one selected from an oxide, a nitride, and a carbide.

16 Claims, 7 Drawing Sheets

(51) Int. Cl.
  *C09K 11/62*      (2006.01)
  *H01L 33/48*      (2010.01)
  *H01L 33/50*      (2010.01)
  *H01L 33/38*      (2010.01)
  *B82Y 20/00*      (2011.01)
  *B82Y 40/00*      (2011.01)

(52) U.S. Cl.
  CPC ............... *H01L 2933/0025* (2013.01); *H01L 2933/0041* (2013.01); *H01L 2933/0083* (2013.01); *Y10S 977/774* (2013.01); *Y10S 977/813* (2013.01); *Y10S 977/892* (2013.01); *Y10S 977/95* (2013.01)

(56) References Cited

U.S. PATENT DOCUMENTS

| | | | |
|---|---|---|---|
| 2013/0058102 A1* | 3/2013 | Lin | H01L 33/46 362/296.04 |
| 2015/0179537 A1* | 6/2015 | Shioji | H01L 29/41 257/773 |
| 2015/0280071 A1 | 10/2015 | Takenaga et al. | |
| 2016/0079479 A1* | 3/2016 | Yamana | H01L 51/5268 257/98 |
| 2020/0011507 A1* | 1/2020 | Nagasaki | F21S 41/16 |

FOREIGN PATENT DOCUMENTS

| | | | |
|---|---|---|---|
| JP | 2001-035814 A | 2/2001 |
| JP | 2001-210845 A | 8/2001 |
| JP | 2001-284642 A | 10/2001 |
| JP | 2001-332762 A | 11/2001 |
| JP | 3346735 B2 | 11/2002 |
| JP | 2003-163373 A | 6/2003 |
| JP | 2005-072148 A | 3/2005 |
| JP | 2005-197289 A | 7/2005 |
| JP | 2005-311272 A | 11/2005 |
| JP | 2005-325386 A | 11/2005 |
| JP | 2006-108161 A | 4/2006 |
| JP | 2006-120913 A | 5/2006 |
| JP | 2006-165467 A | 6/2006 |
| JP | 2006-302890 A | 11/2006 |
| JP | 2006-302891 A | 11/2006 |
| JP | 2006-332032 A | 12/2006 |
| JP | 2007-013093 A | 1/2007 |
| JP | 2007-243074 A | 9/2007 |
| JP | 2007-273975 A | 10/2007 |
| JP | 2009-088299 A | 4/2009 |
| JP | 2009-519608 A | 5/2009 |
| JP | 2009-164423 A | 7/2009 |
| JP | 4362170 B2 | 11/2009 |
| JP | 2010-153825 A | 7/2010 |
| JP | 2010-524257 A | 7/2010 |
| JP | 2010272592 A | 12/2010 |
| JP | 2011-035275 A | 2/2011 |
| JP | 2011-222603 A | 11/2011 |
| JP | 2012-062564 A | 3/2012 |
| JP | 2013-065856 A | 4/2013 |
| JP | 2013105546 A | 5/2013 |
| JP | 2013-125883 A | 6/2013 |
| JP | 2013-149616 A | 8/2013 |
| JP | 2013-149911 A | 8/2013 |
| JP | 2013-151735 A | 8/2013 |
| JP | 5470673 B2 | 4/2014 |
| JP | 2014-139997 A | 7/2014 |
| JP | 2014-524674 A | 9/2014 |
| JP | 5664625 B2 | 2/2015 |
| JP | 2015-106642 A | 6/2015 |
| JP | 2015-144245 A | 8/2015 |
| JP | 2015192099 A | 11/2015 |
| WO | 2010-084746 A1 | 7/2010 |

* cited by examiner

Peak Luminous Efficiency

FIG. 9

SEMICONDUCTOR ELEMENT, SEMICONDUCTOR DEVICE, AND METHOD FOR MANUFACTURING SEMICONDUCTOR ELEMENT

CROSS-REFERENCE TO RELATED APPLICATION

This is a divisional application of U.S. patent application Ser. No. 15/590,458, filed May 9, 2017, which claims priority under 35 U.S.C. § 119 to Japanese Patent Application No. 2016-095688, filed May 11, 2016, the disclosure of which is hereby incorporated by reference in its entirety.

BACKGROUND

The present disclosure relates to a semiconductor element, a semiconductor device, and a method for manufacturing a semiconductor element.

A semiconductor light emitting device having a semiconductor light emitting element in which a semiconductor light emitting structure and electrodes are formed on a substrate and a mounting board on which the semiconductor light emitting element is mounted via bumps is known. For such a semiconductor light emitting element to have a greater light output, there are methods for reflecting the light emitted by the active layer, such as by providing a reflective layer to thereby increase the light extraction efficiency of the semiconductor light emitting element.

As a method for increasing the light extraction efficiency, for example, Japanese Unexamined Patent Application Publication No. 2005-72148 discloses a nitride-based semiconductor element having: a crystal substrate; a reflective layer composed of metal material such as Ag and disposed below a back surface of the crystal substrate; an adhesion layer disposed between the crystal substrate and the reflective layer; and a protective layer disposed on a side of the reflective layer opposite the adhesion layer.

Japanese Unexamined Patent Application Publication No. 2007-243074 discloses a nitride-based light-emitting diode in which a semiconductor light emitting element is provided with a reflective layer, and a dielectric multilayered film disposed in contact with the reflective surface of the reflective layer for facilitating the reflection of light.

In recent years, attempts have been made to improve the adhesion between a dielectric multilayered film and an Ag reflective layer by interposing a Ni thin film between the dielectric multilayered film and the reflective layer.

SUMMARY

A semiconductor element according to an embodiment of the present disclosure includes a semiconductor layer, a conductor layer, a dielectric multilayered film, and a reflective layer, disposed in that order, the reflective layer containing Ag as a major component and containing particles of at least one selected from an oxide, a nitride, and a carbide.

A semiconductor device according to an embodiment of the present disclosure has the semiconductor element described above, a base in which the semiconductor element is mounted on the mounting surface so that the reflective layer is on the mounting surface side, and a phosphor that covers the semiconductor element.

A method for manufacturing the semiconductor element according to an embodiment of the present disclosure includes forming a conductor layer on a semiconductor layer, forming a dielectric multilayered film on the conductor layer, and forming a reflective layer containing Ag as a major component and containing particles of at least one selected from an oxide, a nitride, and a carbide.

The semiconductor element and the semiconductor device according to the present disclosure can achieve good adhesion between the dielectric multilayered film and the reflective layer as well as high reflectance of the reflective layer. The method of manufacturing the semiconductor element according to the present disclosure can manufacture a semiconductor element having good adhesion between the dielectric multilayered film and the reflective layer as well as high reflectance of the reflective layer.

DETAILED DESCRIPTION

Embodiments according to the present disclosure will be described below with reference to the accompanying drawings. It should be appreciated, however, that the embodiments described below are illustrations of a semiconductor element and a semiconductor device to give a concrete form to technical ideas of the present embodiments, and the present embodiments are not specifically limited to the description below. Unless otherwise specified, any dimensions, materials, shapes and relative arrangements of the parts described in the embodiments are given as an example and not as a limitation. Furthermore, the sizes, positional relations, and so forth of the members shown in the drawings may be exaggerated for the sake of clarity. In the explanations below, the same designations and reference numerals basically indicate the same or similar members for which detailed explanations are omitted when appropriate.

Semiconductor Element

Description will be given of a semiconductor element according to an embodiment of the present disclosure. The semiconductor element is a semiconductor light emitting element.

Figure 1A:
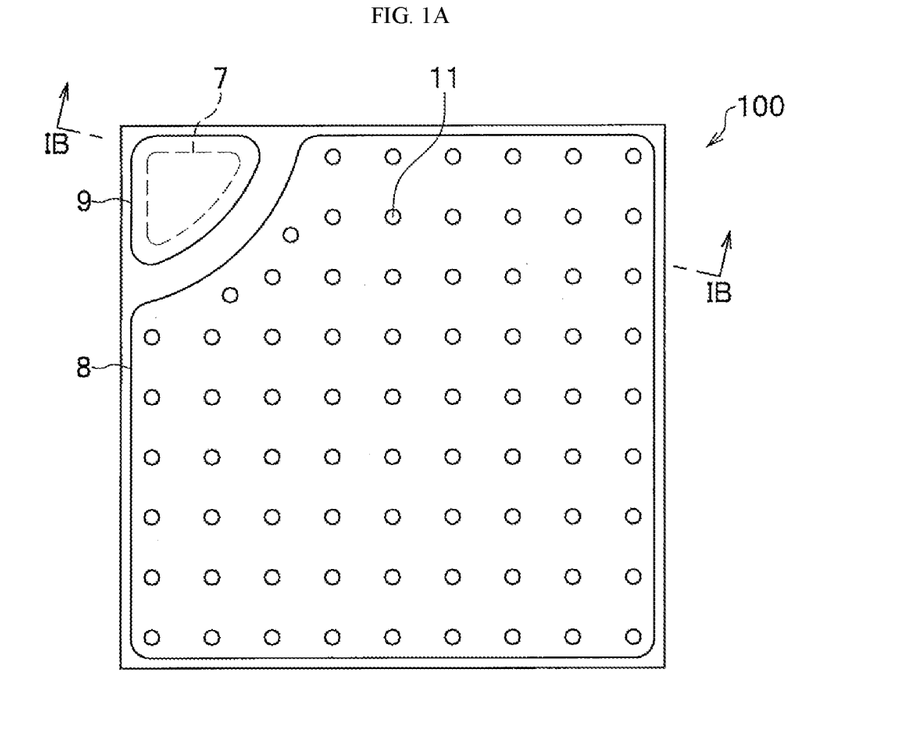
FIG. 1A is a schematic plan view of a construction of a semiconductor light emitting element according to an embodiment of the present disclosure.
Figure 1B:
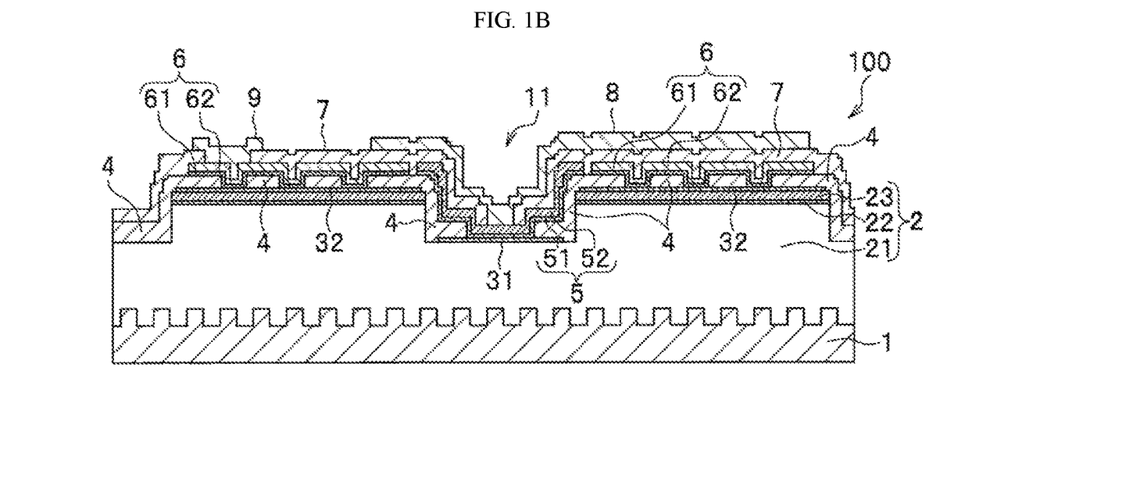
FIG. 1B is a schematic cross-sectional view of the construction of the semiconductor light emitting element, taken along line IB-IB in FIG. 1A.
Figure 2A:
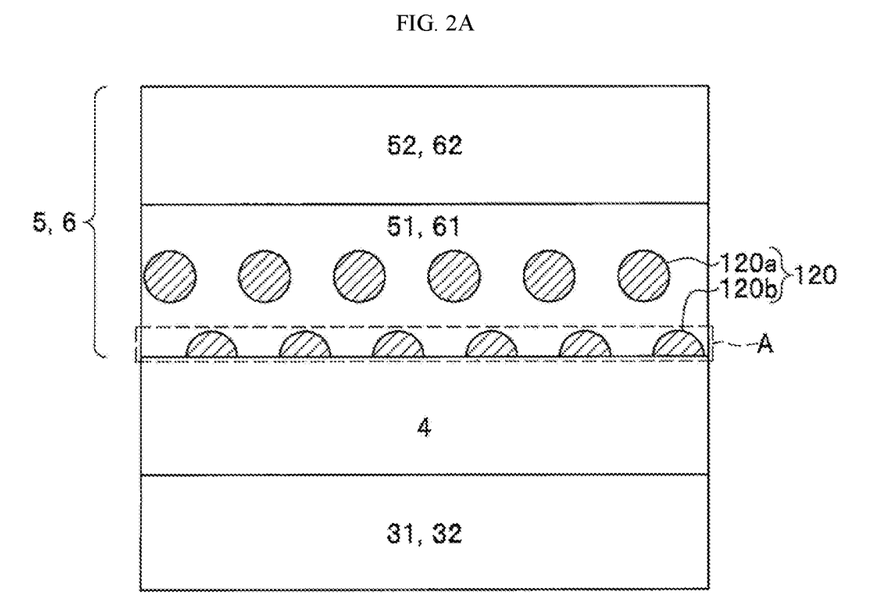
FIG. 2A is a schematic cross-sectional view of an interface between a dielectric multilayered film and a reflective layer in a semiconductor light emitting element according to the embodiment of the present disclosure.
Figure 2B:
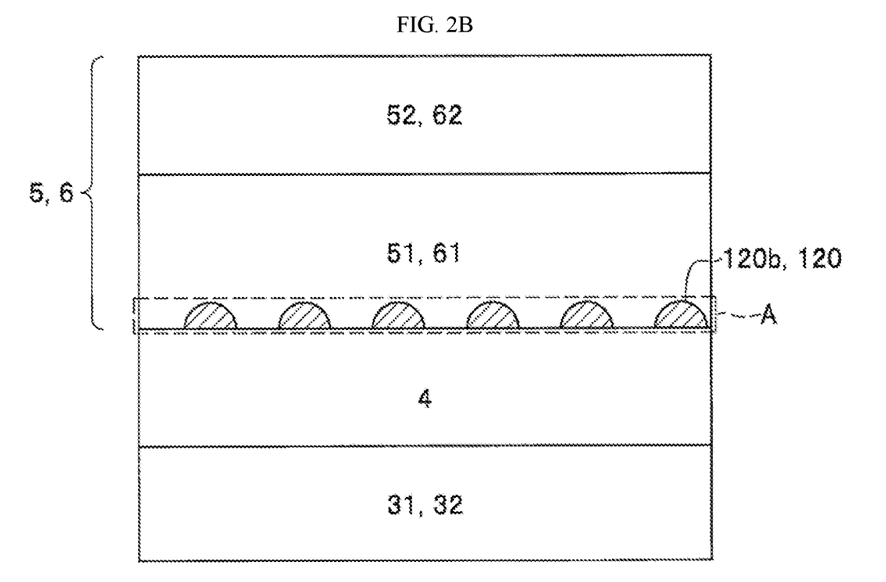
FIG. 2B is a schematic cross-sectional view of an interface between a dielectric multilayered film and a reflective layer and in a semiconductor light emitting element according to the embodiment of the present disclosure.
Figure 3A:
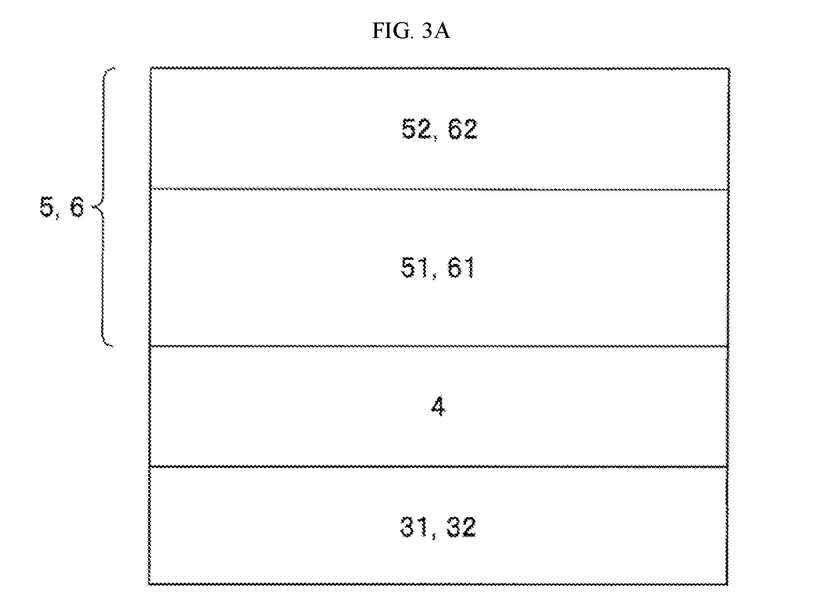
FIG. 3A is a schematic cross-sectional view of an interface between a dielectric multilayered film and a reflective layer in a semiconductor light emitting element of a reference example.
Figure 3B:
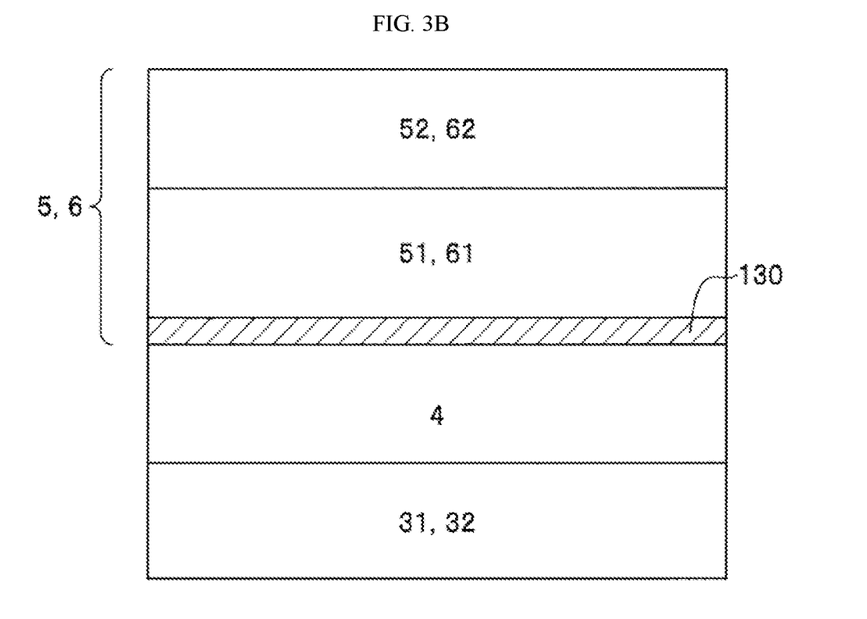
FIG. 3B is a schematic cross-sectional view of an interface between a dielectric multilayered film and a reflective layer in a semiconductor light emitting element of a reference example.

FIG. 1A is a schematic plan view of a semiconductor light emitting element 100 according to an embodiment of the present disclosure. FIG. 1B is a schematic cross-sectional view of the semiconductor light emitting element 100, taken along line IB-IB in FIG. 1A. A different scale is used for FIG. 1B than that of FIG. 1A for the sake of explanation. FIG. 2A and FIG. 2B are schematic cross-sectional views showing the interface between a dielectric multilayered film and a reflective layer, and a condition of the oxide in the semiconductor light emitting element 100, according to an embodiment of the present disclosure. FIG. 3A is a schematic cross-sectional view showing a condition of the interface between a dielectric multilayered film and a reflective film in a semiconductor light emitting element according to a reference example. FIG. 3B is a schematic cross-sectional view showing a condition of the interface between the dielectric multilayered film and the reflective film, and a condition of a layered oxide, in the semiconductor light emitting element according to the reference example. FIG. 2A and FIG. 2B schematically illustrate the condition of the oxide in the reflective layer so it can be easily understood.

The semiconductor light emitting element 100 primarily includes a substrate 1, a semiconductor stack 2 disposed on the substrate 1, an n-side conductor layer 31 and a p-side conductor layer 32 formed on the semiconductor stack 2, a dielectric multilayered film 4 disposed on the n-side conductor layer 31 and the p-side conductor layer 32, an n-side reflective layer 51 and a p-side reflective layer 61 disposed on the dielectric multilayered film 4, an n-side upper electrode 52 and a p-side upper electrode 62 disposed on the n-side reflective layer 51 and the p-side reflective layer 61, a protective film 7 covering an n-side electrode 5 and a p-side electrode 6, and an n-side bonding electrode 8 and a p-side bonding electrode 9 disposed on the protective film 7.

Substrate

The substrate 1 can be of any substrate material that can allow for epitaxial growth of the semiconductor stack 2 without specifically limiting the size, the thickness or the like. For the substrate 1, moreover, a light-transmissive substrate can be used. In the case of forming the semiconductor stack 2 with a nitride semiconductor such as Ga, for example, the substrate material include insulating substrates, such as sapphire having any of the C-plane, the A-plane, and the R-plane as the principal plane, and spinel (MgAlO$_2$O$_4$), as well as oxide substrates, such as lithium niobate and neodymium gallate lattice-bonded with SiC, ZnS, ZnO, Si, GaAs, diamond, or a nitride semiconductor.

Semiconductor Stack

The semiconductor stack 2 has a first semiconductor layer 21 (n-type semiconductor layer) and a second semiconductor layer 23 (p-type semiconductor) of different conductivity types that are successively stacked on the substrate 1. Moreover, it is provided with an active layer 22 between the n-type semiconductor layer 21 and the p-type semiconductor layer 23.

In the present embodiment, the semiconductor light emitting element 100 is rectangular in shape in a plan view, and in a perimeter portion thereof, the p-type semiconductor 23 and the active layer 22 in their entirety, and a portion of the n-type semiconductor 21 are removed from the upper face of the semiconductor stack 2. A perimeter portion of the semiconductor light emitting element 100 refers to an area from the outermost perimeter to a prescribed inner position of the semiconductor light emitting element 100.

The semiconductor stack 2 is provided with holes 11 formed by removing from the upper face thereof the p-type semiconductor layer 23 and the active layer 22 in their entirety, and a portion of the n-type semiconductor layer 21.

Preferably, a nitride semiconductor such as In$_X$Al$_Y$Ga$_{1-X-Y}$N (0≤X, 0≤Y, X+Y<1) or the like is used as the material for the n-type semiconductor layer 21, the active layer 22, and the p-type semiconductor layer 23. These semiconductor layers may be of a single layer structure, a multilayer structure composed of layers of different compositions and thicknesses, or of a superlattice structure. The active layer 22, in particular, is preferably of a single or multiple quantum well structure formed by stacking thin films that produce quantum effects.

The size of the semiconductor stack 2 is not specifically defined, and for example, can have the length in the range of from 200 to 2000 μm and the width in the range of from 200 to 2000 μm. In this embodiment, the a light emitting element of about 1400 μm in length and about 1400 μm in width is illustrated in the drawings as an example.

N-Side Conductor Layer and P-Side Conductor Layer

The n-side conductor layer 31 establishes ohmic contact with the n-type semiconductor layer 21, and p-side conductor layer 32 similarly establishes ohmic contact with the p-type semiconductor layer 23.

The n-side conductor layer 31 and the p-side conductor layer 32 are disposed on the upper face of the semiconductor stack 2. Here, being "disposed on the upper face of the semiconductor stack 2" includes being disposed on the upper face of the exposed n-type semiconductor layer 21 in addition to being disposed on the upper face of the p-type semiconductor layer 23.

In the present embodiment, the n-side conductor layer 31 is provided at a bottom face of each hole 11, while the p-side conductor layer 32 is disposed on an upper face of the p-type semiconductor layer 23. The locations of the n-side conductor layer 31 and the p-side conductor layer 32 can be suitably adjusted in accordance with the shape of the semiconductor light emitting element 100.

The n-side conductor layer 31 and the p-side conductor layer 32 are formed with an electrically-conductive oxide, a metal thin film made by stacking Au and Ni, or the like. It is particularly preferable to employ a transparent conducive oxide.

Examples of electrically-conductive oxides include an oxide including at least one element selected from the group consisting of Zn, In, Sn, Ga, and Ti. Among all, indium tin oxide (ITO) is highly light transmissive for the visible light (visible region) as well as highly conductive, and thus is a suitable material for the n-side conductor layer 31 and the p-side conductor layer 32.

Dielectric Multilayered Film

The dielectric multilayered film 4, which is a distributed Bragg reflector (DBR), is formed by stacking several sets of a low refractive index layer and a high refractive index layer, and selectively reflects light of a prescribed wavelength. Specifically, the dielectric multilayered film 4 is formed by stacking two or more kinds of films each having a different refractive index and a thickness of ¼n times a prescribed wavelength of light, where n denotes the refractive index, and is able to efficiently reflect light having a prescribed wavelength.

The dielectric multilayered film 4 is disposed on the upper face of the semiconductor stack 2. Here, being "formed on the upper face of the semiconductor stack 2" includes that disposed directly on the upper face of the semiconductor stack 2 and that disposed on the semiconductor stack 2 via the n-side conductor layer 31 and the p-side conductor layer 32.

In this embodiment, the dielectric multilayered film 4 is partially disposed on the upper faces of the n-side conductor layer 31 and the p-side conductor layer 32, on the bottom and lateral faces of each hole 11, and on the bottom and lateral faces of the perimeter portion of the semiconductor light emitting element 100.

Preferably, the material for the dielectric multilayered film 4 is an oxide of at least one element selected from Si, Ti, Zr, Nb, Ta, and Al, or a nitride of at least one element selected from Si, Ti, Zr, Nb, Ta, and Al. The dielectric multilayered film 4 preferably contains this oxide or nitride as a major component.

Note that it "contains as a major component" means that the film may be composed of the oxide or nitride alone, or may be composed of the oxide or nitride, and minute amounts of impurities or other minute amounts of elements. This also applies to similar descriptions below of elements contained in another layer.

N-Side Electrode and P-Side Electrode

The n-side electrode 5 is composed of an n-side reflective layer 51 and an n-side upper electrode 52. The p-side electrode 6 is composed of a p-side reflective layer 61 and a p-side upper electrode 62. The n-side electrode 5 and the p-side electrode 6 are the electrodes for supplying electric current to the semiconductor light emitting element 100 from the outside. Furthermore, the n-side reflective layer 51 and the p-side reflective layer 61 are for reflecting the light that passed through the n-side conductor layer 31, the p-side conductor layer 32, the dielectric multilayered film 4, or the like. The n-side electrode 5 and the p-side electrode 6 are disposed on the upper face of the semiconductor stack 2. Here, being "disposed on the upper face of the semiconductor stack 2" includes, in addition to being disposed directly on the upper face of the semiconductor stack 2, being disposed on the semiconductor stack 2 via another layer such as the n-side conductor layer 31, the p-side conductor layer 32, the dielectric multilayered film 4, or the like.

In this embodiment, the n-side electrode 5 is disposed on the bottom and lateral faces of the holes 11 via the n-side conductor layer 31 and the dielectric multilayered film 4. The n-side electrode 5 is disposed on the upper face of the n-type semiconductor 21 and a portion thereof is electrically connected to the n-side conductor layer 31. The p-side electrode 6 is disposed on the upper face of the p-type semiconductor 23 via the p-side conductor layer 32 and the dielectric multilayered film 4 so as not to be electrically connected to the n-side electrode 5.

The n-side reflective layer 51 and the p-side reflective layer 61 are a silver alloy having Ag as a major component and containing an oxide 120, and is a layer for increasing the light extraction efficiency by increasing the reflectance towards the substrate. The oxide 120 is substantially uniformly distributed in the n-side reflective layer 51 and the p-side reflective layer 61.

As shown in FIGS. 2A and 2B, since the n-side reflective layer 51 and the p-side reflective layer 61 each contains the oxide 120, a pseudo transition layer, in which the oxide 120 and Ag in the n-side reflective layer 51 and the p-side reflective layer 61 coexist, is formed in the n-side and p-side reflective layers 51 and 61 at their interface with the dielectric multilayered film 4. The formation of such a pseudo transition layer can increase the adhesion between the dielectric multilayered film 4 and the n-side reflective layer 51 or the p-side reflective layer 61, and thus increases the reliability of the semiconductor light emitting element 100. Note that in FIGS. 2A and 2B, the reference sign A schematically indicates the pseudo transition layer.

In other words, a portion of the oxide 120 is in contact with or situated in close proximity to the dielectric multi-layered film 4. Note that being "disposed in close proximity to the dielectric multilayered film 4" means that the oxide 120 is situated close enough to the dielectric multilayered film 4 to form a pseudo transition layer in the n-side reflective layer 51 or the p-side reflective layer 61 at the interface between the dielectric multilayered film 4 and the n-side reflective layer 51 or the p-side reflective layer 61 even if not in contact with the dielectric multilayered film 4.

Furthermore, because the adhesion between the dielectric multilayered film 4 and the n-side reflective layer 51 or the p-side reflective layer 61 of the semiconductor light emitting element 100 is enhanced, it is unlikely for the n-side reflective layer 51 or the p-side reflective layer 61 to peel off. This makes it unnecessary to provide an adhesion layer between the dielectric multilayered film 4 and the n-side reflective layer 51 or the p-side reflective layer 61, thereby eliminating the absorption of light by the adhesion layer which would otherwise be provided.

The semiconductor light emitting element 100 can achieve high emission intensity because the n-side reflective layer 51 and the p-side reflective layer 61 contain the oxide 120.

Here, the coexistence of the oxide 120 and Ag in the n-side reflective layer 51 and the p-side reflective layer 61 at the interface between the dielectric multilayered film 4 and n-side reflective layer 51 or the p-side reflective layer 61 means that a portion of the oxide 120, together with Ag, is in contact with or in close proximity to the dielectric multilayered film 4. The pseudo transition layer is not an actual layer and rather means a kind of layer produced by the presence of the oxide 120 and Ag at the interface.

The presence of the oxide 120 in the n-side reflective layer 51 and the p-side reflective layer 61 causes the layers to exhibit a pinning effect, which suppresses crystal grains of Ag, the major component of the n-side reflective layer 51 and the p-side reflective layer 61, from growing. This reduces the growth of crystal grains due to the thermal history in the assembly process of the semiconductor device, so that the smoothness of the surface of the n-side reflective layer 51 and the p-side reflective layer 61 is maintained and the occurring of voids in the n-side reflective layer 51 and the p-side reflective layer 61 is reduced. This enables the n-side reflective layer 51 and the p-side reflective layer 61 to maintain high reflectance and good heat dissipation properties.

Note that, in FIGS. 2A and 2B, reference numeral 120*a* denotes the oxide 120 dispersed in the n-side reflective layer 51 and the p-side reflective layer 61 in granular form, and reference numeral 120*b* denotes the oxide 120 distributed at the interface between the n-side reflective layer 51 or the p-side reflective layer 61 and the dielectric multilayered film 4. Here, the oxide 120b does not constitute a layer by itself and a part of Ag is in contact with or in close proximity to the dielectric multilayered film 4. So long as a portion of Ag is in contact with or in close proximity to the dielectric multilayered film 4, the particles of oxide 120b may be connected in a mesh form. Note that, when the added amount of the oxide 120 is small, the amount of the oxide 120 distributed or present at the interface is small, and it is likely that the pseudo transition layer is formed such that the oxide 120b is distributed like islands at the interface. Here, the wording "distributed like islands" means that the oxide 120b is not continuously distributed but rather discretely distributed. Even in this case, however, it can be said that the oxide 120b and Ag coexist and thus constitute a pseudo transition layer.

Preferably, the oxide 120 in the n-side reflective layer 51 and the p-side reflective layer 61 is at least one substance selected from $SiO_2$, $Al_2O_3$, $ZrO_2$, $TiO_2$, ZnO, $Ga_2O_3$, $Ta_2O_5$, $Nb_2O_5$, $In_2O_3$, $SnO_2$, NiO, and $HfO_2$. More preferably, the oxide 120 in the n-side reflective layer 51 and the p-side reflective layer 61 is at least one substance selected from $Ga_2O_3$, $Nb_2O_5$, and $HfO_2$, in view of the adhesion with the dielectric multilayered film 4. Using a metal oxide for the oxide 120 in this manner can improve the adhesion with the dielectric multilayered film 4.

Here, FIG. 2A shows the oxide 120 being distributed in the n-side reflective layer 51 and the p-side reflective layer 61 in granular form. As shown in FIG. 2B, however, the oxide 120 may be localized towards the dielectric multilayered film 4 without being dispersed in the n-side reflective layer 51 and the p-side reflective layer 61 in granular form. In other words, the oxide 120 may be only in contact with or distributed in close proximity to the dielectric multilayered film 4. Even in the case of distributing the oxide 120 in the n-side reflective layer 51 and the p-side reflective layer 61, the oxide 120 may still be localized towards the dielectric multilayered film 4. Even in the case of localizing the oxide 120 towards the dielectric multilayered film 4, the effect similar to that in the case of uniformly distributing the oxide 120 in the n-side reflective layer 51 and the p-side reflective layer 61 can be achieved.

In the case of the format shown in FIG. 3A where the reflective layer is a pure silver layer not containing any oxides, or in the case of the format shown in FIG. 3B where the oxide layer 130 containing only an oxide, the effect of the semiconductor light emitting element 100 according to this embodiment cannot be achieved.

The content of the oxide 120 in each of the n-side reflective layer 51 and the p-side reflective layer 61 is only required to be greater than 0.01% by mass relative to the total mass of the n-side reflective layer 51 and the p-side reflective layer 61. In other words, the content of the oxide 120 in the n-side reflective layer 51 is only required to be greater than 0.01% by mass relative to the total mass of the n-side reflective layer 51, and the content of the oxide 120 in the p-side reflective layer 61 is only required to be greater than 0.01% by mass with respect to the total mass of the n-side reflective layer 61.

An oxide 120 content greater than 0.01% by mass increases the adhesion between the dielectric multilayered film 4 and the n-side reflective layer 51 or the p-side reflective layer 61. In view of the adhesion between the dielectric multilayered film 4 and the n-side reflective layer 51 or the p-side reflective layer 61, the content of the oxide 120 in each of the n-side reflective layer 51 and the p-side reflective layer 61 is preferably at least 0.02% by mass, and more preferably at least 0.03% by mass. In addition, in view of the reflectance (initial reflectance) of the n-side reflective layer 51 and the p-side reflective layer 61, the content of the oxide 120 in each of the n-side reflective layer 51 and the p-side reflective layer 61 is preferably at most 5% by mass, more preferably at most 4% by mass, and still more preferably at most 2.5% by mass.

The higher the transparency of the oxide 120 contained in the n-side reflective layer 51 and the p-side reflective layer 61, the higher the reflectance of the n-side reflective layer 51 and the p-side reflective layer 61 results. Thus, the higher the transparency of the oxide 120, the more the content of the oxide 120 in the n-side reflective layer 51 and the p-side reflective layer 61 may be.

The content of the oxide 120 in the n-side reflective layer 51 and the p-side reflective layer 61 can be determined by inductively coupled plasma atomic emission spectrometry (ICP-AES).

The n-side upper electrode 52 and the p-side upper electrode 62 can be formed with a metal material such as Ni, Rh, Au, Ti, Pt, W, or the like, used singly, or an alloy thereof. Such a metal material can be used as a single layer or multiple layers. These can suitably impart functions such as barrier properties and stress adjustment.

Protective Film

The protective film 7 is an insulation film that covers the surfaces of the n-side electrode 5 and the p-side electrode 6, and functions as the protective film of the semiconductor light emitting element 100. Covering the surfaces of the n-side electrode 5 and the p-side electrode 6 with the protective film 7 can prevent the migration of the materials that form the n-side electrode 5 and the p-side electrode 6. Depending on the shape of the semiconductor light emitting element 100, the protective film 7 can prevent the migration of materials attributable to the contact between the n-side reflective layer 51 and the n-side bonding electrode 8, and between the p-side reflective layer 61 and the p-side bonding electrode 9.

For the material for the protective film 7, at least one oxide selected from the group consisting of Si, Ti, and Ta, or an insulation material such as SiN, or the like can be used.

N-Side Bonding Electrode and P-Side Bonding Electrode

The n-side bonding electrode 8 and the p-side bonding electrode 9 are electrodes for supplying electric current to the semiconductor light emitting element 100 from the outside. The n-side bonding electrode 8 is connected to the n-side electrode 5 and disposed to extend over the protective film 7. The p-side bonding electrode 9 is connected to the p-side electrode 6 and disposed to extend over the protective film 7 so as not to be electrically connected to the n-side bonding electrode 8. The n-side bonding electrode 8 and the p-side bonding electrode 9 are disposed to expose the protective film 7 in some areas, such as the perimeter areas of the semiconductor light emitting element 100 and the gap between the n-side bonding electrode 8 and the p-side bonding electrode 9.

Providing the n-side bonding electrode 8 and the p-side bonding electrode 9 can improve the mountability of the semiconductor light emitting element 100 because they increase the contact areas between the semiconductor light emitting element 100 and a mounting board when flip-chip mounting the semiconductor light emitting element on the mounting board, which improves adhesion.

The n-side bonding electrode 8 and the p-side bonding electrode 9 can be formed with a metal material such as Ag, Al, Ni, Rh, Au, Ti, Pt, W, or the like used singly, or an alloy thereof. The n-side bonding electrode 8 and the p-side bonding electrode 9 can be constructed as a single layer or multiple layers of such a metal material. In view of adhesion, it is particularly preferable to form the n-side bonding electrode 8 and the p-side bonding electrode 9 with an Au layer containing Au as the major component.

Operation of Semiconductor Light Emitting Element

Description will be given of the operation of the semiconductor light emitting element 100 shown in FIGS. 1A and 1B. Here, the semiconductor light emitting element 100 is a flip-chip mounting type light emitting diode.

In the semiconductor light emitting element 100, when electric current is provided through the n-side bonding electrode 8, the n-side electrode 5, and the n-side conductor layer 31, and through the p-side bonding electrode 9, the p-side electrode 6, and the p-side conductor layer 32 to the semiconductor stack 2, the active layer 22 emits light. The light emitted from the active layer 22 propagates in the semiconductor stack 2, and the light that travels downward in FIG. 1B is extracted from the substrate 1 side of the semiconductor light emitting element 100. The light that travels upward in FIG. 1B is reflected downward by the dielectric multilayered film 4, the n-side electrode 5, and the p-side electrode 6, and is extracted from the substrate 1 side of the semiconductor light emitting element 100.

Method for Manufacturing the Semiconductor Light Emitting Element

Figure 4:
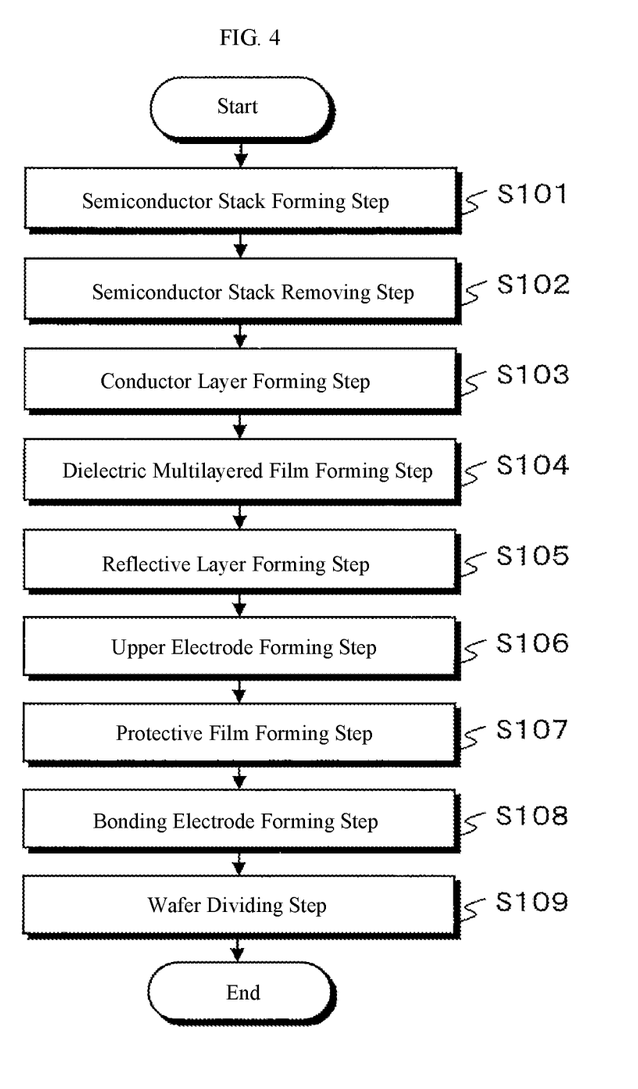
FIG. 4 is a flowchart of a manufacturing method for a semiconductor light emitting element according to an embodiment of the present disclosure.

Next, description will be given of a manufacturing method for a semiconductor light emitting element 100 with reference to FIGS. 1A, 1B, 2A, 2B, and 4. FIG. 4 is a flowchart illustrating a method for manufacturing the semiconductor light emitting element 100 according to an embodiment of the present disclosure.

The method for manufacturing the semiconductor light emitting element 100: a semiconductor stack forming step S101, a semiconductor stack removing step S102, a conductor layer forming step S103, a dielectric multilayered film forming step S104, a reflective layer forming step S105, an upper electrode forming step S106, a protective layer forming step S107, a bonding electrode forming step S108, and a wafer dividing step S109, which are carried out in that order.

Each step will be explained next. The details of each member of the semiconductor light emitting element 100 are the same as those described above, and therefore the descriptions thereof will be omitted as appropriate.

Semiconductor Stack Forming Step

In the semiconductor stack forming step S101, a semiconductor stack 2 is formed by successively stacking an n-type semiconductor layer 21 and a p-type semiconductor layer 23, which are of different conductivity types on the substrate 1.

In the semiconductor stack forming step S101, each of the semiconductor layers, i.e., an n-type semiconductor layer 21, an active layer 22, and a p-type semiconductor layer 23, is grown on the substrate 1 made of sapphire or the like using a nitride semiconductor or the like by MOCVD or the like. It is preferable to subsequently anneal the substrate 1 on which each semiconductor has been grown (hereinafter the substrate before being divided together with the layers formed thereon are referred to as a wafer) in nitrogen ambient at about 600 to 700° C. to reduce the resistivity of the p-type semiconductor layer 23.

Semiconductor Stack Removing Step

In the semiconductor stack removing step S102, the n-type semiconductor layer 21 is exposed by removing a portion of the semiconductor stack 2.

Here, the semiconductor light emitting element 100 is rectangular in shape in a plan view, and in a perimeter portion of the semiconductor light emitting element 100, the semiconductor stack 2 is removed from the upper face side to a prescribed depth to expose the n-type semiconductor layer 21 in the perimeter portion.

The method of removing the semiconductor stack 2 is explained below. First, a mask having a prescribed shape is formed on the annealed wafer using a photoresist. Then, the n-type semiconductor layer 21 is exposed by removing the p-type semiconductor 23, the active layer 22, and a portion of the n-type semiconductor layer 21 by RIE (reactive ion etching). After etching, the photoresist is removed.

Conductor Layer Forming Step

In the conductor layer forming step S103, an n-side conductor layer 31 is formed on the n-type semiconductor layer 21, and a p-side conductor layer 32 is formed on the p-type semiconductor layer 23.

The n-side conductor layer 31 and the p-side conductor layer 32 can be formed, for example, by sputtering ITO. The areas where the n-type conductor layer 31 or the p-type conductor layer 32 is not provided can be formed by masking the areas with a photoresist and using a lift-off technique.

Dielectric Multilayered Film Forming Step

In the dielectric multilayered film forming step S104, a dielectric multilayered film 4 is formed on the n-side conductor layer 31 and the p-side conductor layer 32.

The dielectric multilayered film 4 can be formed by stacking dielectric materials on the semiconductor stack 2, the n-side conductor layer 31, and the p-side conductor layer 32 by a sputtering method, a vapor deposition method, or the like. The dielectric multilayered film 4 can be formed by combining dielectric materials having considerably different refractive indices (e.g., a combination of $SiO_2$ and $ZrO_2$, a combination of $SiO_2$ and $Nb_2O_5$, or the like), and alternately stacking them. The areas where the dielectric multilayered film 4 is not provided can be formed by masking the areas with a photoresist and using a lift-off technique.

Reflective Layer Forming Step

In the reflective layer forming step S105, an n-side reflective layer 51 and a p-type reflective layer 61 each containing Ag as a major component and containing an oxide 120 are formed on the dielectric multilayered film 4.

First, a photoresist is applied over the entire surface of the wafer, followed by removing by photolithography the photoresist present in the areas where electrodes will be formed.

The n-side reflective layer 51 and the p-type reflective layer 61 can be formed, for example, by a sputtering method or a vapor deposition method. Specifically, they can be formed by a simultaneous sputtering method using an Ag target (including pure silver target) and an oxide target, a sputtering method using an alloy target containing Ag and an oxide, or a vapor deposition method using an alloy vapor deposition material containing Ag and an oxide 120. These sputtering methods and vapor deposition method are capable of forming an n-side reflective layer 51 and a p-type reflective layer 61 in which an oxide 120 is dispersed.

The alloy used in the alloy target or the alloy vapor deposition material contains Ag as a major component and contains an oxide 120. Here, nanoscale particles of the oxide 120 are dispersed in the Ag alloy. An alternative to the vapor deposition method using an alloy vapor deposition material to form the n-side reflective layer 51 and the p-type reflective layer 61 is to vapor-deposit a deposition material composed of Ag (including pure silver) and a deposition material composed of an oxide 120 at the same time.

Other conditions and procedures of the sputtering methods and vapor deposition method can follow known conditions and procedures.

Upper Electrode Forming Step

In the upper electrode forming step S106, an n-side upper electrode 52 is formed on the n-side reflective layer 51, and a p-side upper electrode 62 is formed on the p-side reflective layer 61.

After forming the n-side reflective layer 51 and the p-side reflective layer 61, the material for the n-side upper electrode 52 and the p-side upper electrode 62 is formed by a sputtering method or a vapor deposition method, before lifting off the photoresist together with the metal film formed thereon. In this manner, the metal film remains only in the areas designated for forming the electrodes, thereby patterning the n-side reflective layer 51, the n-side upper electrode 52, the p-side reflective layer 61, and the p-side upper electrode 62, and resulting in the n-side electrode 5 and the p-side electrode 6.

Protective Film Forming Step

In the protective film forming step S107, a protective film 7 is formed which covers the n-side electrode 5 and the p-side electrode 6.

The protective film 7 can be disposed by forming, for example, an $SiO_2$ film by using a known method, such as a vapor deposition method or a sputtering method. The areas where the protective film 7 is not disposed can be formed by masking the areas with a photoresist and subsequently lifting it off.

In this embodiment, since the n-side electrode 5 and the p-side electrode 6 are shielded by the protective film 7, the migration of metal materials can be prevented.

Bonding Electrode Forming Step

In the bonding electrode forming step S108, an n-side bonding electrode 8 which is electrically connected to the n-side electrode 5 and a p-side bonding electrode 9 which is electrically connected to the p-side electrode 6 are formed on the upper face of the protective film 7.

Using the same metal material, the n-side bonding electrode 8 and the p-side bonding electrode 9 are simultaneously formed as described below. First, a photoresist is applied to the entire surface of the wafer, and the photoresist present in the areas where the electrodes will be formed is removed by photolithography. Then, a metal film is formed on the entire surface of the wafer, followed by lifting off the photoresist together with the metal film formed thereon. In this manner, the metal film remains only in the areas defined for forming the electrodes, resulting in the n-side bonding electrode 8 and the p-side bonding electrode 9.

Other particulars about the areas where the n-side bonding electrode 8 and the p-side bonding electrode 9 are disposed are as described earlier in relation to the semiconductor light emitting element 100.

Wafer Dividing Step

In the wafer dividing step S109, the wafer after the n-side bonding electrode 8 and the p-side bonding electrode 9 have been formed is divided into chips.

In this embodiment, a plurality of semiconductor light emitting element units are formed in a matrix on the substrate 1, and the wafer is divided into chips after the formation of the semiconductor light emitting elements 100 have been completed.

Specifically, the wafer to be divided into chips is first irradiated by a laser beam from the side of the substrate 1 along the cut paths so that the laser beam is focused at an inner portion of the light-transmissive substrate 1. This produces altered portions in the substrate 1. The altered portions are band-like cutting grooves extending in a thickness direction of the substrate 1, i.e., in a perpendicular direction to the principal surfaces of the substrate 1. Examples of the source of the laser beam include a femtosecond laser. Next, the wafer is cut along the cut paths to be divided into chips of individual semiconductor light emitting elements. The wafer can be cut by scribing or dicing, for example.

Moreover, before dividing the wafer into chips, the thickness of the substrate 1 may be reduced by polishing the substrate 1 from the back face thereof to a prescribed thickness.

In this embodiment, since the p-side semiconductor layer 23 of the semiconductor light emitting element 100 when divided is not exposed at the lateral faces of the semiconductor light emitting element 100, the n-type semiconductor layer 21 and the p-type semiconductor layer 23 will not be shorted by a soldering material. Thus, it can be mounted during the manufacture of a light emitting device in a simplified manner.

Variations

In the semiconductor light emitting element 100 described above, the n-side reflective layer 51 and the p-side reflective layer 61 contained an oxide 120, but a nitride or a carbide may be used in place of the oxide 120. Even when a nitride or carbide is used, effects similar to those achieved in the case of an oxide 120 can be achieved. The particles to be contained in the n-side reflective layer 51 and the p-side reflective layer 61 may be of any one, two or more selected from an oxide 120, a nitride, and a carbide. In other words, particles of at least one selected from an oxide 120, a nitride, and a carbide can be used. The particulars explained earlier with regard to the oxide 120 also similarly apply to the case of using the particles of at least one selected from an oxide 120, a nitride, and a carbide.

In the case of using the particles of at least one selected from an oxide 120, a nitride, and a carbide, the n-side reflective layer 51 and the p-type reflective layer 61 can be formed, for example, by a simultaneous sputtering method using an Ag target (including pure silver target) and a target made of the particles of at least one of those described above, a sputtering method using a target containing Ag and the particles of at least one of those described above, or a vapor deposition method using a deposition material containing Ag and the particles of at least one of those described above.

Semiconductor Device

A semiconductor device according to an embodiment of the present disclosure will be explained next. The semiconductor device is a light emitting device.

Figure 5:
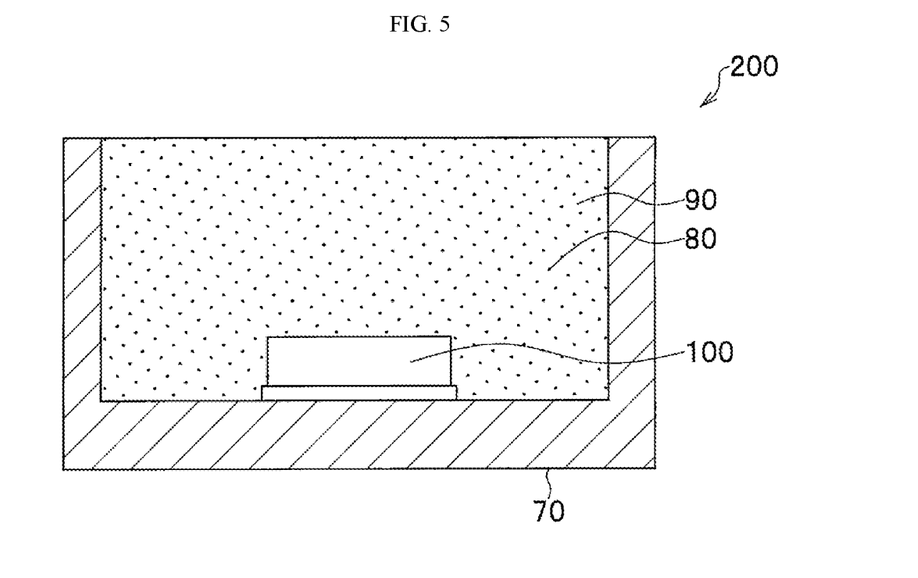
FIG. 5 is a schematic cross-sectional view of a construction of a light emitting device according to an embodiment of the present disclosure.
Figure 6:
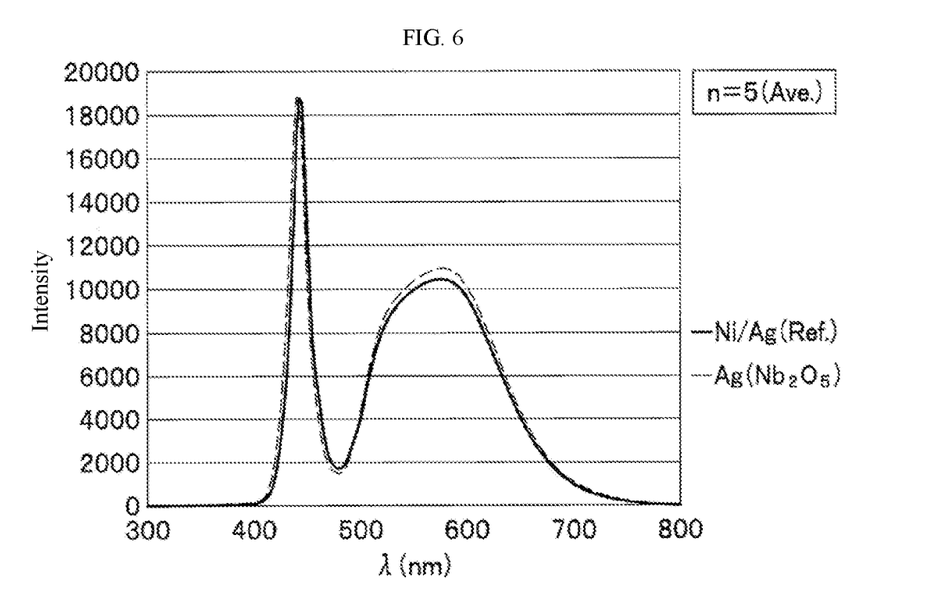
FIG. 6 is a graph of an emission spectra of a light emitting device having a Ni/Ag reflective layer and a light emitting device having an $Ag(Nb_2O_5)$ reflective layer.

FIG. 5 is a schematic cross-sectional view of a light emitting device 200 according to an embodiment of the present disclosure, and FIG. 6 is a graph showing an emission spectra of the light emitting device 200 having a Ni/Ag reflective layer and a light emitting device having an Ag($Nb_2O_5$) reflective layer.

As shown in FIG. 5, the light emitting device 200 has a semiconductor light emitting element 100, a base 70 for mounting the semiconductor light emitting element 100, and a light transmissive member 90 containing a phosphor 80 which covers the semiconductor light emitting element 100.

In the light emitting device 200, the semiconductor light emitting element 100 is mounted on the mounting surface of the base 70, which is a package having a recess, so that the n-side reflective layer 51 and the p-side reflective layer 61 are on the mounting surface side. In other words, the light emitting device 200 has the semiconductor light emitting element 100 mounted face down on the base 70. The light emitting device 200 is such that the semiconductor light emitting element 100 is sealed with a light transmissive member 90 which contains a phosphor 80, i.e., the semiconductor light emitting element 100 is covered with the phosphor 80.

In the light emitting device 200, since the semiconductor light emitting element 100 is sealed with a light transmissive member 90 containing a phosphor 80, a blue light emitted from the semiconductor light emitting element 100 is converted by the phosphor 80 into long-wavelength light ranging from the green region to the red region. The long-wavelength light emitted by the phosphor 80 reenters the semiconductor light emitting element 100. However, the long-wavelength light is barely reflected by the dielectric multilayered film 4, but is reflected by the n-side reflective layer 51 and the p-side reflective layer 61.

As shown in FIG. 6, with respect to long-wavelength light, the light emitting device employing an $Ag(Nb_2O_5)$ reflective layer had a higher emission intensity and a larger luminous flux than the light emitting device employing a Ni/Ag reflective layer. Moreover, the X coordinate in the chromaticity coordinates is shifted to the larger side (right side). As such, the light emitting device 200 according to the embodiment can release the long-wavelength light from the phosphor 80 at a higher intensity. The above matter will be discussed in detail later.

Next, the light transmissive member and the phosphor will be explained.

Light Transmissive Member and Phosphor

The light transmissive member 90 contains a light diffuser, and a phosphor 80 which converts at least a portion of the light from the light emitting element 100 to light having a different wavelength. Specific examples of the light transmissive member 90 containing a phosphor 80 include resins, glass, inorganic materials or the like that contain the powder of a phosphor 80. A sintered body of a phosphor 80 may be that formed by sintering the phosphor alone, or a mixture of the phosphor and a sintering aid. In the case of sintering a mixture of a phosphor and a sintering aid, it is preferable to use an inorganic material, such as silicon oxide, aluminum oxide, or titanium oxide for the sintering aid. This can reduce discoloration and deformation of the sintering aid attributable to light and heat even in the case of a high output semiconductor light emitting element 100.

For the light transmissive member 90, the higher the degree of transparency, the more preferable it is. The thickness of the light transmissive member 90 is not particularly limited, and can be suitably changed. It can be set, for example, in the range of from about 50 to about 300 μm.

For the phosphor 80, any phosphor used in this field can be suitably selected. Example of phosphors excitable by light emitted from a blue light emitting element or ultraviolet light emitting element include cerium-activated yttrium aluminum garnet-based phosphors (YAG:Ce); cerium-activated lutetium aluminum garnet-based phosphors (LAG: Ce); nitrogen-containing calcium aluminosilicate-based phosphors activated by either or both of europium and chromium ($CaO—Al_2O_3—SiO_2$); europium-activated silicate-based phosphors (($Sr,Ba)_2SiO_4$); nitride-based phosphors, such as ($\beta$-SiAlON phosphors, CASN-based phosphors, SCASN-based phosphors; KSF-based phosphors ($K_2SiF_6$:Mn); sulfide-base phosphors, and quantum dot phosphors. By combining these phosphors with a blue or ultraviolet light emitting element, light emitting devices of various emission colors (e.g., a white light emitting device) can be produced. In the case of producing a light emitting device capable of emitting white light, the type and the concentration of the phosphor 80 contained in the light transmissive member 90 are adjusted to emit white light. The concentration of the phosphor 80 contained in the light transmissive member 90, for example, is in the range of from about 5 to about 50% by mass.

For the light diffuser that can be contained in the light transmissive member 90, for example, titanium oxide, barium titanate, aluminum oxide, silicon oxide, or the like can be used.

EXAMPLES

Figure 7:
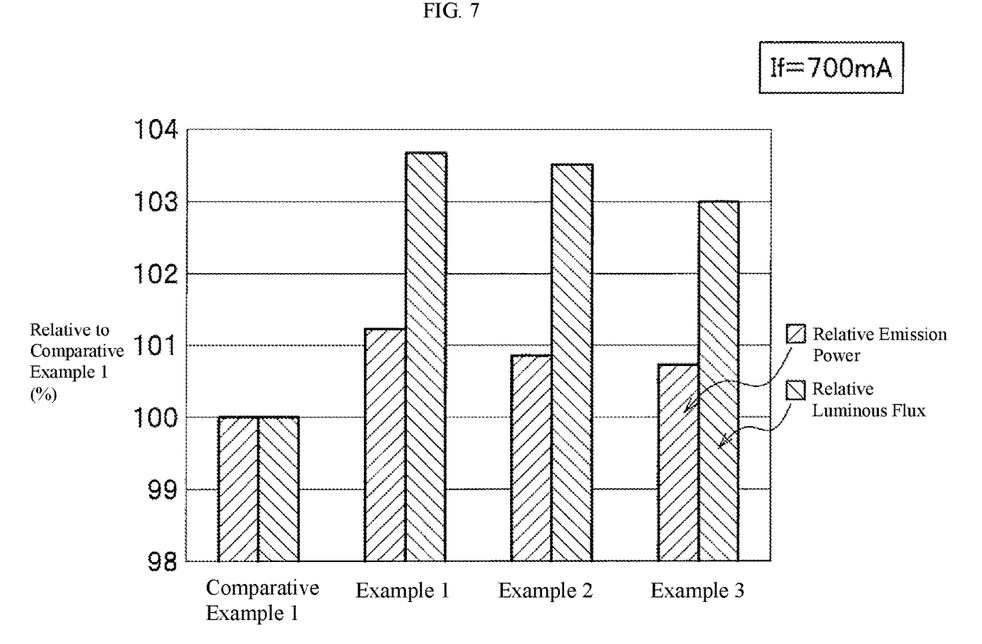
FIG. 7 is a graph comparing emission power and luminous flux of semiconductor light emitting devices in which light emitting elements of examples of the present disclosure and a comparative example are installed.
Figure 8:
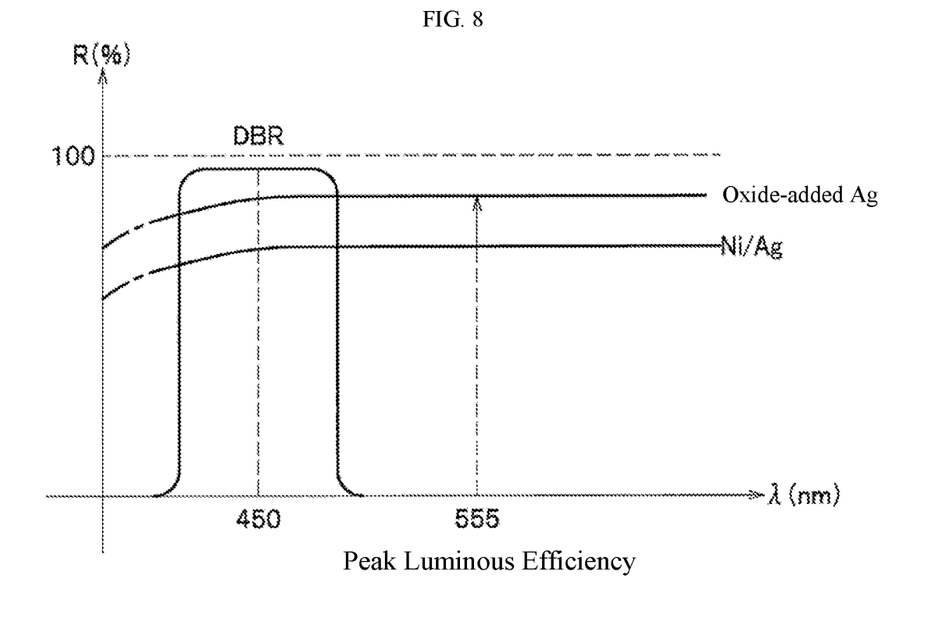
FIG. 8 is a schematic diagram explaining an interface reflectance between a dielectric multilayered film and an oxide-containing Ag reflective layer comparing an example of the present disclosure and a comparative example.
Figure 9:
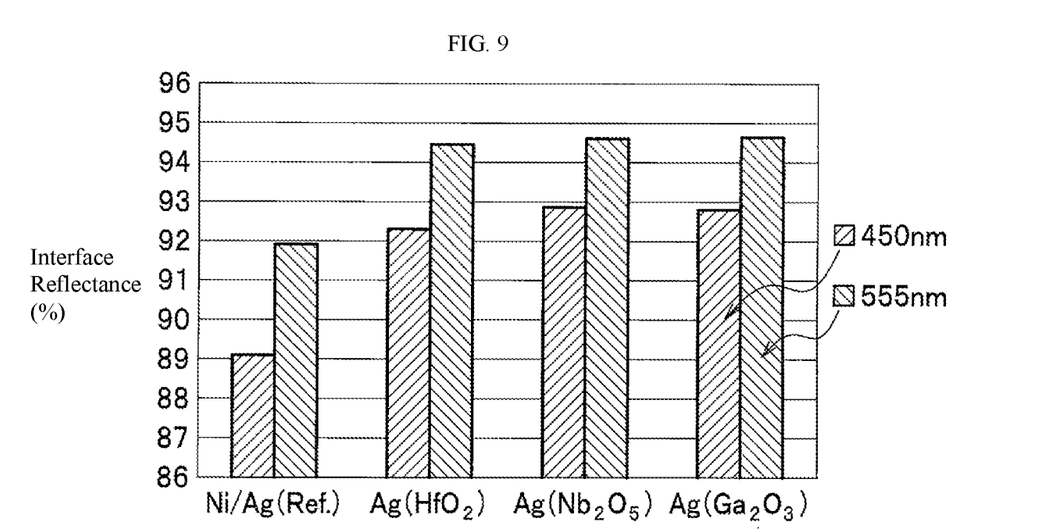
FIG. 9 is a graph showing an interface reflectance of a reflective layer comparing examples of the present disclosure and a comparative example.

Examples of embodiments of the present disclosure will be explained below. FIG. 7 is a graph comparing emission power and luminous flux of semiconductor light emitting devices in which the semiconductor light emitting elements according to the examples of the present disclosure and a comparative example are installed. FIG. 8 is a schematic diagram explaining the interface reflectance of the dielectric multilayered film/oxide-added Ag reflective layer structures in the examples and the comparative example. FIG. 9 is a graph showing the interface reflectance of the reflective layer in the examples and the comparative example.

Evaluation of Emission Power

Example 1

A semiconductor light emitting element having the structure shown in FIGS. 1A and 1B was produced as described below.

First, on the surface of a sapphire substrate, an n-type nitride semiconductor layer, an active layer, and a p-type nitride semiconductor layer for emitting blue light having a peak emission wavelength of about 450 nm were stacked as the semiconductor stack of the semiconductor light emitting element. Next, the p-type nitride semiconductor layer, the active layer, and a portion of the n-type nitride semiconductor layer in the area designated for forming an n-side electrode were removed. A light transmissive conductor layer made of ITO was disposed on the exposed n-type nitride semiconductor layer and on the p-type nitride semiconductor layer. A dielectric multilayered film was further formed by disposing three pairs of $(Nb_2O_5/SiO_2)n$ (where n is a natural number). A layer of $Nb_2O_5$ was 90 nm, and a layer of $SiO_2$ was 50 nm. On the dielectric multilayered film, an n-side reflective layer and a p-side reflective layer containing $HfO_2$ were formed to a thickness of 120 nm by a simultaneous sputtering method using an Ag target and an $HfO_2$ target. The $HfO_2$ content in each of the reflective layer measured in an ICP-AES analysis was 0.24% by mass. Furthermore, a p-side upper electrode and an n-side upper electrode were suitably formed on the reflective layers by sputtering. Then, a protective film, a p-side bonding electrode, and an n-side bonding electrode were further disposed.

Next, after forming altered portions in the inner portion of the substrate by irradiating a laser beam, the wafer was cut along the cut paths to divide it into chips of individual semiconductor light emitting elements. In this manner, the semiconductor light emitting element of Example 1 was obtained.

Example 2

In the process for manufacturing Example 2, a semiconductor light emitting element of Example 2 was produced in a similar manner to that for Example 1 except for forming a reflective layer containing $Nb_2O_5$ instead of the reflective layer containing $HfO_2$ of Example 1. The reflective layer containing $Nb_2O_5$ was formed by a simultaneous sputtering method using an Ag target and an $Nb_2O_5$ target. The $Nb_2O_5$ content in each of the reflective layer measured in an ICP-AES analysis was 0.07% by mass.

Example 3

In the process for manufacturing Example 3, a semiconductor light emitting element of Example 3 was produced in a similar manner to that for Example 1 except for forming a reflective layer containing $Ga_2O_3$ instead of the reflective layer containing $HfO_2$ of Example 1. The reflective layer containing $Ga_2O_3$ was formed by a simultaneous sputtering method using an Ag target and a $Ga_2O_3$ target. The $Ga_2O_3$ content in each of the reflective layer measured in an ICP-AES analysis was 0.03% by mass.

Comparative Example 1

In the process for manufacturing Comparative Example 1, a semiconductor light emitting element of Comparative Example 1 was produced in a similar manner to that for Example 1 except for forming a 3 Å Ni layer and a 120 nm pure silver layer on the dielectric multilayered film in that order instead of the reflective layer containing $HfO_2$ of Example 1. The Ni layer was formed by a sputtering method using a Ni target, and the pure silver layer was formed by a sputtering method using an Ag target only.

Semiconductor light emitting devices were produced by flip-chip mounting each of the semiconductor light emitting elements of Example 1, Example 2, Example 3, and Comparative Example 1 in a package using bumps for the purpose of measuring the emission power. The emission power of each device was then measured. FIG. 7 shows the results. These were the results at current. If=700 mA, assuming that the emission power of Comparative Example 1 was 100. The emission power of Example 1, Example 2, and Example 3 was each about 0.8 to 1.2% higher than that of Comparative Example 1.

Evaluation of Luminous Flux

Semiconductor light emitting devices were produced by flip-chip mounting each of the semiconductor light emitting elements of Example 1, Example 2, Example 3, and Comparative Example 1 in a package using bumps for the purpose of measuring the emission power. Each semiconductor light emitting element was coated with a YAG:Ce phosphor. Then, using a 10-inch integrating sphere manufactured by Labsphere, the luminous flux of each device was measured under the condition of applied pulses pw/pe=0.05 ms/5 ms. FIG. 7 shows the results. These were the results at current. If=700 mA, assuming that the luminous flux of Comparative Example 1 was 100. The luminous flux of Example 1, Example 2, and Example 3 was each about 3 to 3.7% higher than that of Comparative Example 1.

The reasons why the effect of improving the luminous flux is greater than the emission power will be explained below.

As shown in FIG. 1B, a dielectric multilayered film 4 which reflects nearly 100% of the light (about 450 nm) emitted from the semiconductor light emitting element 100 (hereinafter referred to as a dice) is formed on the n-side conductor layer 31 and the p-side conductor layer 32 (see FIG. 8). The vertical axis in FIG. 8 represents interface reflectance (R).

Since the dielectric multilayered film 4 has insulation properties, electrical continuity must be provided between the n-side conductor layer 31 and the n-side electrode 5 and between the p-side conductor layer 32 and the p-side electrode 6 by creating a number of openings to allow electric current to uniformly flow to the n-side conductor layer 31 and the p-side conductor layer 32. Since the dielectric multilayered film 4 is absent in the openings, the reflectance of the reflective layer affects the extraction of the blue light emitted. However, the oxide-added Ag reflective layer's reflectance ranges from about 92 to 93% (the reflectance for 450 nm in FIG. 9) as compared to the Ni/Ag layer's reflectance of about 89% for the blue region. This increases the emission power by about 0.8 to 1.2% as shown in FIG. 7.

Since the openings are provided out of necessity for electrical continuity, and the dielectric multilayered film 4 is superior when considering reflectance only, the size of each opening is set to a minimum area. Accordingly, the improvement of emission power relative to the blue light released from the dice as a whole attributable to the change in the reflective layer remains at about 0.8 to 1.2%.

Now, a white LED having a phosphor surrounding the dice will be discussed. The blue light output from the dice is converted by the phosphor into longer wavelength light ranging from the green to the red region.

Then, the long-wavelength light emitted from the phosphor reenters the dice. The reentered long-wavelength light reaches the dielectric multilayered film 4, but because the dielectric multilayered film 4 barely reflects the long-wavelength light, the light reaches the reflective layer. In other words, the reentered long-wavelength light is reflected by the reflective layer that covers the dielectric multilayered film 4.

The oxide-added silver layer's reflectance is about 94.5% (the reflectance for 555 nm in FIG. 9) as opposed to the Ni/Ag layer's reflectance of 92%. Thus, the luminous flux of a white LED having a phosphor arranged in the surrounding of the dice improves by about 3 to 3.7% in those cases where an oxide-added silver is used as shown in FIG. 7.

The fact that the luminous flux in the case of a white LED increases about 3 to 3.7% when the emission power in the case of a blue LED only improves about 0.8 to 1.2% is attributable to the mechanism by which the light passing though the n-side conductor layer 31 and the p-side conductor layer 32 is reflected which differs between blue light and long-wavelength light. In other words, since blue light is primarily reflected by the dielectric multilayered film, but is reflected by the reflective layer at the openings minimally disposed in the dielectric multilayered film, the improvement relative to blue light as a whole is limited even if the reflectance of the reflective layer is increased. In contrast, long-wavelength light barely reflected by the dielectric multilayered film passes through the dielectric multilayered film, and thus is greatly affected by the reflective layer which lies ahead and covers substantially the entire surface of the dielectric multilayered film.

As described above, in the construction that includes a dielectric multilayered film and a reflective layer disposed on the outer side of the dielectric multilayered film, an improvement in the reflectance of the reflective layer leads to a more intense release of the long-wavelength light from the phosphor.

This is also clear from the relatively more intense emission from the phosphor (see FIG. 6) achieved when the reflective layer was changed from Ni/Ag to oxide-added Ag in the white LED where the X coordinate shifted to the larger side (to the right).

Based on the above, the semiconductor light emitting elements of Example 1, Example 2, and Example 3 each employing an oxide-added Ag reflective layer can demonstrate a greater effect in terms of luminous flux involving long-wavelength light from a phosphor.

Evaluation of Interface Reflectance

The reflective layer containing $HfO_2$ in Example 1, the reflective layer containing $Nb_2O_5$ in Example 2, the reflective layer containing $Ga_2O_3$ in Example 3, and the pure silver reflective layer with a Ni layer in Comparative Example 1 were investigated with respect to reflectance at the interface. Specifically, each reflective layer was formed on a quartz substrate, and the interface reflectance was measured through the quartz substrate using a spectrophotometer manufactured by Hitachi High-Technologies Corporation, model U-3010 (ROM Ver: 2520 10). As shown in FIG. 9, the reflectance of the oxide-containing reflective layers in Example 1, Example 2, and Example 3 were higher than the reflectance of the reflective layer in Comparative Example 1 which did not contain oxide. It can be known from this that by adding an oxide using the proportions described above, the reflectance can be increased as compared to the pure silver layer provided with a Ni Layer.

Evaluation of Peel Off Rate

The reflective layer containing $HfO_2$ in Example 1, the reflective layer containing $Nb_2O_5$ in Example 2, the reflective layer containing $Ga_2O_3$ in Example 3, and the pure silver reflective layer with a Ni layer in Comparative Example 1 were investigated with respect to the rate of peel off at the interface with the dielectric multilayered film by conducting tape tests. Specifically, a dielectric multilayered film without any pattern was formed first on a sapphire substrate. Then, p-side electrodes having the structures shown in Table 1 were formed on the dielectric multilayered film by photolithography and lift off. For each sample, 10000 p-side electrodes were formed. Next, a UV sheet was attached to the samples on which the p-side electrodes have been formed, and the UV sheet was subsequently peeled off. The number of patterns in which the p-side electrode peeled off was counted and the peel off rates were calculated.

TABLE 1

| Dielectric Multilayered Film | p-side Electrode | | Tape Test Peel Off Rate |
|---|---|---|---|
| Film Type | Structure | Thickness (Å)* | (%) |
| $SiO_2$ | Ag/Ni/Ti/Pt | 1k/3k/1k/1k | 90 |
| $SiO_2$ | Ni/Ag/Ni/Ti/Pt | 3/1k/3k/1k/1k | 0 |
| $SiO_2$ | Ag($Nb_2O_5$)/Ni/Ti/Pt | 1k/3k/1k/1k | 0.02 |
| $SiO_2$ | Ag($Ga_2O_3$)/Ni/Ti/Pt | 1k/3k/1k/1k | 0.03 |
| $SiO_2$ | Ag($HfO_2$)/Ni/Ti/Pt | 1k/3k/1k/1k | 0.03 |

As shown in Table 1, the peel off rates of the oxide-containing reflective layers were approximately the same as that of the pure silver layer provided with a Ni layer, i.e., the reflective layers barely peeled off.

As explained above, the semiconductor light emitting element according to this embodiment has good reflectance of light, and the adhesion between the dielectric multilayered film and the reflective layer is approximately the same as that of the semiconductor light emitting element which includes a Ni thin film between the dielectric multilayered film and the Ag reflective layer.

The semiconductor element and the method of manufacturing the same according to embodiments of the present disclosure have been specifically described in the embodiments of the present disclosure, but the scope of the present invention is not limited to the above description and should be construed broadly based on the scope of claims. In addition, various modifications and variations made based on the above description are also included in the scope of the present invention, as a matter of course.

The semiconductor elements according to the embodiments of the present disclosure are applicable to all the semiconductor light emitting device using light emitting elements, such as various lighting equipment, illumination devices for vehicle, displays, and indicators. In addition, the semiconductor elements according to the embodiments of the present disclosure are also applicable to devices using optical elements such as light receiving devices, semiconductor devices such as power transistors, and semiconductor electronic devices.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method for manufacturing a semiconductor element, comprising:
    forming a p-side conductor layer and a n-side conductor layer on a semiconductor layer,
    forming a dielectric multilayered film on the p-side conductor layer and the n-side conductor layer, and
    forming, on the dielectric multilayered film, a reflective layer containing Ag as a major component and containing particles of an oxide,
    wherein the forming the reflective layer disposes the particles in contact with the dielectric multilayered film or in close proximity to the dielectric multilayered film,
    wherein the particles are dispersed in the reflective layer,
    wherein the reflective layer contains the particles of at least one oxide selected from $Ga_2O_3$, $Nb_2O_5$, and $HfO_2$, and
    wherein a single continuous portion of the reflective layer vertically covers the p-side conductor layer and the n-side conductor layer.

2. The method for manufacturing a semiconductor element according to claim 1, wherein the forming the reflective layer employs one of a simultaneous sputtering method using an Ag target and an oxide target, a sputtering method using an alloy target containing Ag and an oxide, and a vapor deposition method using an alloy vapor deposition material containing Ag and an oxide.

3. The method for manufacturing a semiconductor element according to claim 1, wherein the particles are localized towards the dielectric multilayered film.

4. The method for manufacturing a semiconductor element according to claim 1, wherein a content of the particles is at least 0.01% by mass and at most 5% by mass of a total mass of the reflective layer.

5. The method for manufacturing a semiconductor element according to claim 1 further comprising, before the forming the p-side conductor layer and the n-side conductor layer on the semiconductor layer, forming the semiconductor layer on a substrate.

6. The method for manufacturing a semiconductor element according to claim 1 further comprising, after forming the reflective layer:
    forming a protective film on the reflective layer, and
    forming an Au layer on the protective film.

7. The method for manufacturing a semiconductor element according to claim 1, wherein the semiconductor element is a semiconductor light emitting element.

8. The method for manufacturing a semiconductor element according to claim 7, wherein the semiconductor light emitting element emits blue light.

9. The method for manufacturing a semiconductor element according to claim 1, wherein, in the forming the dielectric multilayered film on the p-side conductor layer and the n-side conductor layer, the dielectric multilayered film is formed such that a part of the p-side conductor layer and/or the n-side conductor layer is exposed, and
    wherein, in the forming the reflective layer, the reflective layer is formed on the part of the p-side conductor layer and/or the n-side conductor layer exposed from the dielectric multilayered film.

10. The method for manufacturing a semiconductor element according to claim 9, wherein, in the forming the reflective layer, the reflective layer is formed so as to continuously cover the dielectric multilayered film and the p-side conductor layer and the n-side conductor layer.

11. The method for manufacturing a semiconductor element according to claim 1, wherein, in the forming the dielectric multilayered film, the dielectric multilayered is formed by stacking several sets of a low refractive index layer and a high refractive index layer.

12. The method for manufacturing a semiconductor element according to claim 11, wherein the dielectric multilayered film contains an oxide or nitride of at least one element selected from the group consisting of Si, Ti, Zr, Nb, Ta, and Al as a major component.

13. The method for manufacturing a semiconductor element according to claim 12, wherein the dielectric multilayered film is formed by stacking the high refractive index layer made of $Nb_2O_5$ and the low refractive index layer made of $SiO_2$.

14. The method for manufacturing a semiconductor element according to claim 13, wherein the low refractive index layer made of $SiO_2$ is disposed on the outermost surface of the dielectric multilayered film, and
    wherein the reflective layer is formed on the low refractive index layer disposed on the outermost surface of the dielectric multilayered film.

15. The method for manufacturing a semiconductor element according to claim 1, wherein, in the forming the reflective layer, the reflective layer is formed such that the particles of the at least one oxide in granular form are dispersed in the reflective layer and a portion of the particles is in contact with the dielectric multilayered film.

16. The method for manufacturing a semiconductor element according to claim 1, wherein nanoscale particles of the at least one oxide are dispersed in an alloy.

* * * * *